United States Patent
Sahota et al.

(10) Patent No.: US 7,052,969 B1
(45) Date of Patent: May 30, 2006

(54) METHOD FOR SEMICONDUCTOR WAFER PLANARIZATION BY ISOLATION MATERIAL GROWTH

(75) Inventors: Kashmir S. Sahota, Fremont, CA (US); Krishnashree Achuthan, San Ramon, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 147 days.

(21) Appl. No.: 10/190,002

(22) Filed: Jul. 3, 2002

(51) Int. Cl.
*H01L 21/76* (2006.01)
*H01L 21/302* (2006.01)
*H01L 21/461* (2006.01)

(52) U.S. Cl. ............ 438/424; 438/690; 438/692; 438/959

(58) Field of Classification Search .......... 438/690, 438/424, 692, 959
See application file for complete search history.

(56) References Cited

U.S. PATENT DOCUMENTS

| | | | |
|---|---|---|---|
| 5,616,513 A * | 4/1997 | Shepard | |
| 5,786,262 A * | 7/1998 | Jang et al. | 438/424 |
| 5,899,727 A * | 5/1999 | Hause et al. | 438/444 |
| 6,051,480 A * | 4/2000 | Moore et al. | 438/435 |
| 6,121,113 A * | 9/2000 | Takatsuka et al. | 438/424 |
| 6,248,667 B1 * | 6/2001 | Kim et al. | |
| 6,429,092 B1 * | 8/2002 | Beintner et al. | 438/425 |
| 6,468,910 B1 * | 10/2002 | Srinivasan et al. | |
| 6,624,042 B1 * | 9/2003 | Schilling | 438/424 |
| 6,649,488 B1 * | 11/2003 | Lee et al. | 438/424 |

* cited by examiner

*Primary Examiner*—Michael Lebentritt
*Assistant Examiner*—Ron Pompey
(74) *Attorney, Agent, or Firm*—Mikio Ishimaru

(57) ABSTRACT

A method of manufacturing a planarized semiconductor wafer in which a semiconductor wafer is provided with a chemical-mechanical polishing stop layer deposited thereon. A photoresist layer is processed and used to form a patterned chemical-mechanical polishing stop layer and shallow trenches. A shallow trench isolation material is then grown on the chemical-mechanical polishing stop layer and in the shallow trenches, and is chemical-mechanical polished to the chemical-mechanical polishing stop layer.

18 Claims, 5 Drawing Sheets

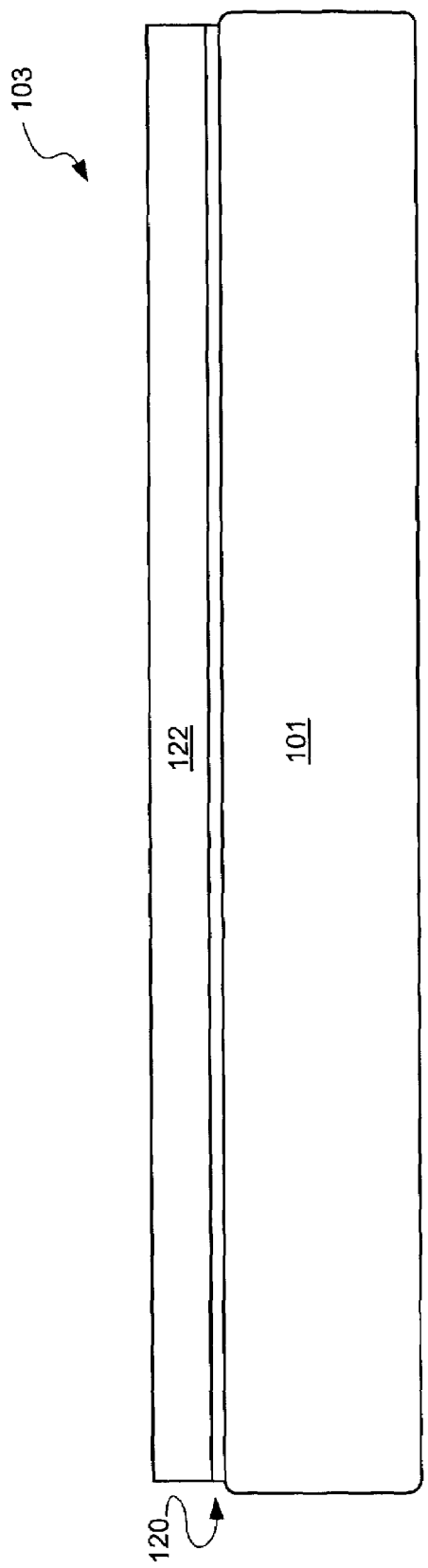
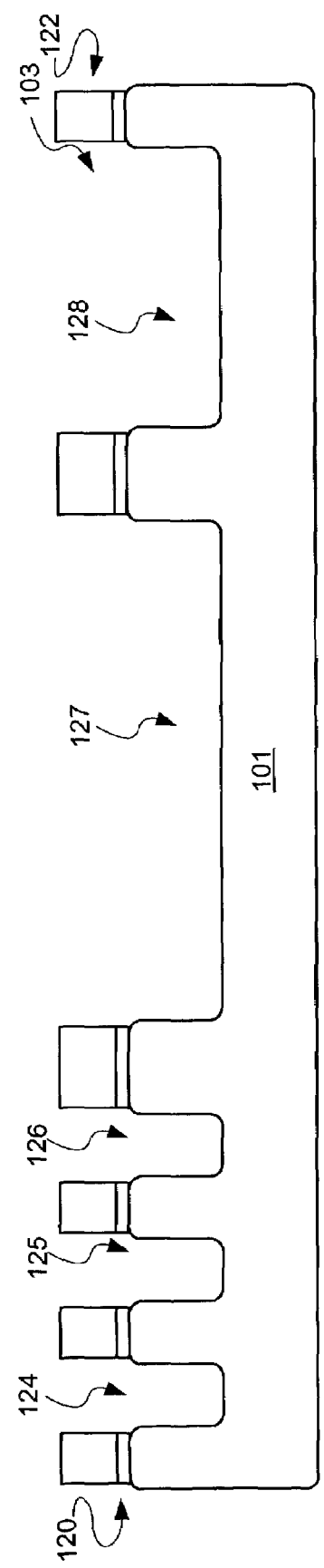

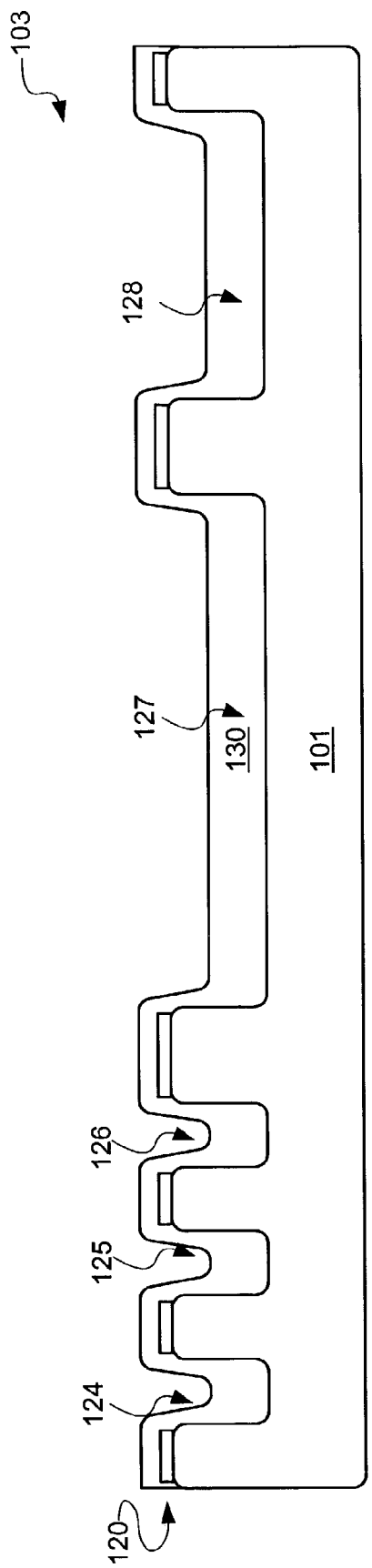
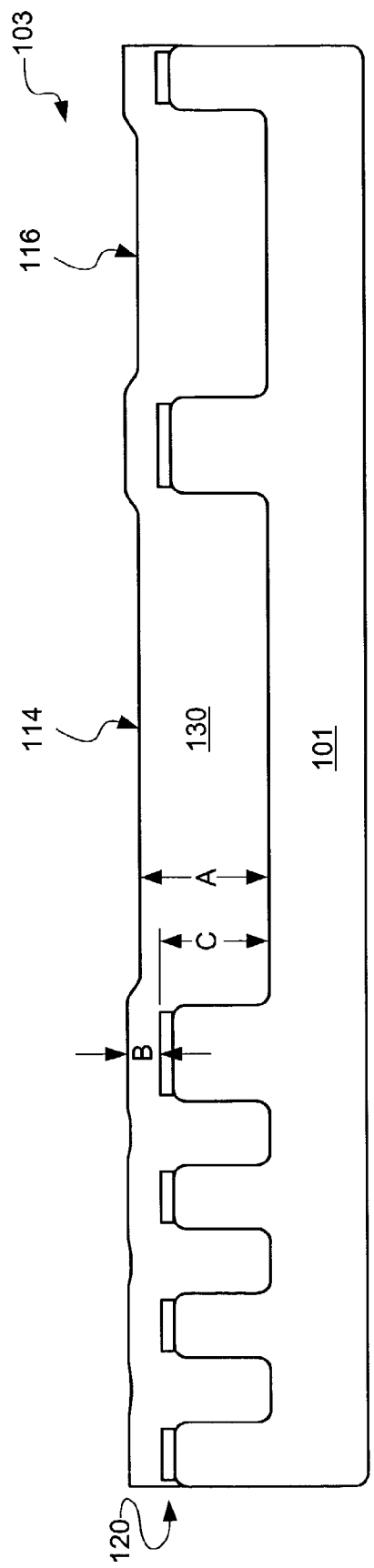

METHOD FOR SEMICONDUCTOR WAFER PLANARIZATION BY ISOLATION MATERIAL GROWTH

BACKGROUND OF THE INVENTION

1. Technical Field

The present invention relates generally to semiconductors and more specifically to an improved fabrication process for making semiconductor memory devices.

2. Background Art

Different types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phones, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology known as "MirrorBit®" Flash memory has been developed which allows multiple bits to be stored in a single cell. In this technology, a memory cell is essentially split into two identical (mirrored) parts, each of which is formulated for storing one of two independent bits.

Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

All memory cells including the MirrorBit Flash memory cells are made up of multiple layers of material which are deposited on a semiconductor substrate. At the same time that the memory cells are being built up in high-density core regions, they are surrounded by low-density peripheral regions containing transistors for input/output circuitry and programming circuitry which are also built up layer upon layer on the semiconductor substrate. The various memory cells in the core and the transistors in the circuit are separated by areas of shallow trench isolation, as well as the individual transistors being separated by shallow trench isolations, which are regions of an insulator such as silicon oxide deposited in trenches in the semiconductor substrate.

As the memory and transistor devices have been made smaller, it has been discovered that it is necessary to have an extremely planar surface of the semiconductor substrate with the shallow trench isolations. Unfortunately, it has been found that the current chemical-mechanical polishing (CMP) processes cause dishing or concavities in the tops of the shallow trench isolations which are relatively broad. This dishing subsequently results in uneven planarization and detrimentally affects the integrated circuit as a whole.

A solution to this problem has been long sought but has long eluded those skilled in the art.

DISCLOSURE OF THE INVENTION

The present invention provides a method of manufacturing a planarized semiconductor wafer in which a semiconductor wafer is provided with a chemical-mechanical polishing stop layer deposited thereon. A photoresist layer is processed and used to form a patterned chemical-mechanical polishing stop layer and shallow trenches. A shallow trench isolation material is then grown on the chemical-mechanical polishing stop layer and in the shallow trenches, and is chemical-mechanical polished to the chemical-mechanical polishing stop layer. The chemical-mechanical polishing stop layer is then removed resulting in a semiconductor wafer that is substantially planar.

The above and additional advantages of the present invention will become apparent to those skilled in the art from a

BRIEF DESCRIPTION OF THE DRAWINGS

FIG. 2 is a cross-sectional view of a partially processed semiconductor wafer;

FIG. 3 is the structure of FIG. 2 after formation of the shallow trenches;

FIG. 4 is the structure of FIG. 3 during an intermediate stage of the growth of a shallow trench isolation material;

FIG. 5 is the structure of FIG. 4 after completion of the growth of the shallow trench isolation material;

BEST MODE FOR CARRYING OUT THE INVENTION

Figure 1:
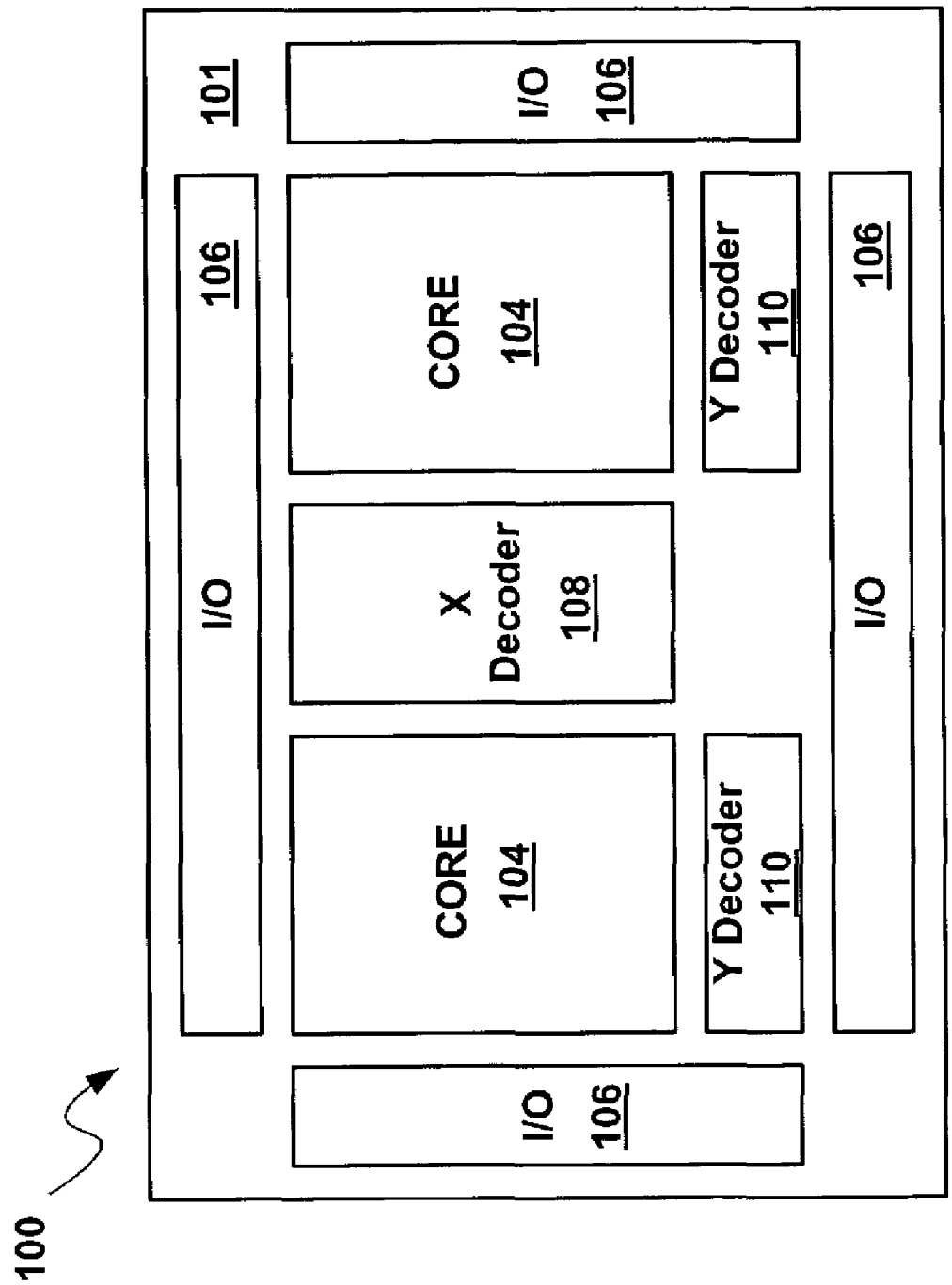
FIG. 1 is a plan view of a MirrorBit Flash EEPROM according to the present invention.

Referring now to FIG. 1, therein is shown a plan view of a MirrorBit® Flash EEPROM 100, which commonly includes a semiconductor substrate 101 in which one or more high-density core regions and one or more low-density peripheral portions are formed. The EEPROM 100 is manufactured according to the process of the present invention. High-density core regions typically include one or more M×N array cores 104 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "thick", "side" and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Referring now to FIG. 2, therein is shown a cross-sectional view of a partially processed semiconductor wafer 103. The semiconductor wafer 103 at this stage of processing includes the semiconductor substrate 101 of a material such as silicon and a chemical-mechanical polishing (CMP) stop layer 120. Over the CMP stop layer 120 is a first photoresist layer 122.

In current geometries, without being limiting, the CMP stop layer 120 should be less than 1000 Å (Angstroms) in thickness and preferably between 500 and 1000 Å. As would be evident, as memory devices are scaled down in size, even thinner layers would be desirable.

Referring now to FIG. 3, therein is shown the structure of FIG. 2 after formation of the shallow trenches. The first photoresist layer 122 has been conventionally processed, patterned, and removed to leave a patterned CMP stop layer 120 on the surface of the semiconductor substrate 101 and shallow trenches 124–128 having similar or different widths formed in the semiconductor substrate 101.

Referring now to FIG. 4, therein is shown the structure of FIG. 3 during an intermediate stage of the growth of a shallow trench isolation (STI) material 130 from the semiconductor substrate 101 to fill the shallow trenches 124 through 128.

For a semiconductor substrate 101 of silicon, the CMP stop layer 120 can be a material such as silicon nitride and the STI material 130 can be a material such as silicon oxide. The silicon oxide can be grown on the silicon using a silane, such as tetraethoxysilane (TEOS), which has a selective tendency to have different rates of growth over silicon and silicon nitride.

Due to the larger growth of oxide on silicon than on silicon nitride, the shallow trenches 124 through 128 fill rapidly with silicon oxide while the areas over the silicon nitride of CMP stop layer 120 grow much slower as shown. Therefore, the silicon oxide is much thicker in the shallow trenches 124 through 128 than above the CMP stop layer 120.

Referring now to FIG. 5, therein is shown the structure of FIG. 4 after completion of the growth of the STI material 130. The STI material 130 is shown grown to its full depth "A" which is deposited in the same time that the thickness "B" is deposited. Ideally, the deposition thickness will be close to a dimension "C", which is the distance from the bottom of the shallow trenches to the top of the CMP stop layer 120.

Figure 6:
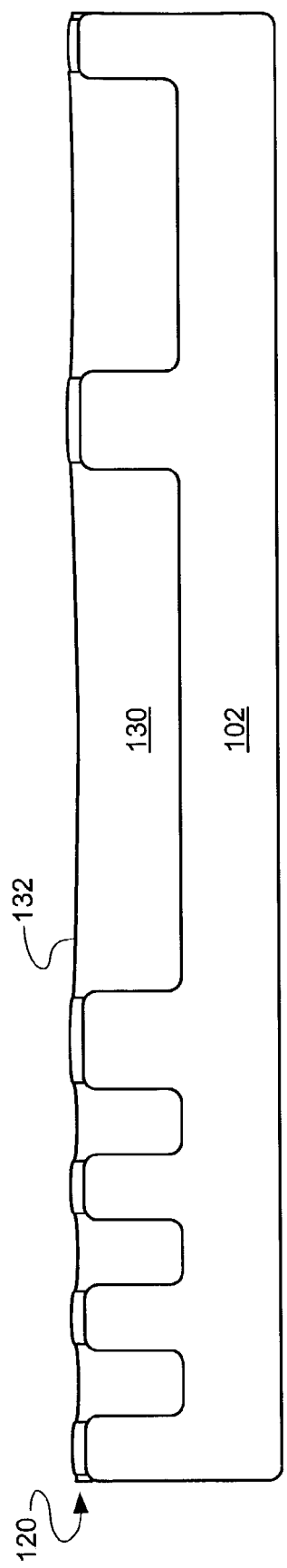
FIG. 6 is the structure of FIG. 5 after chemical-mechanical polishing.

Referring now to FIG. 6, therein is shown the structure of FIG. 4 after a chemical-mechanical polishing process. The CMP process leaves a planar surface 132, which makes the top of the STI material 130 co-planar with the top of the CMP stop layer 120.

Figure 7:
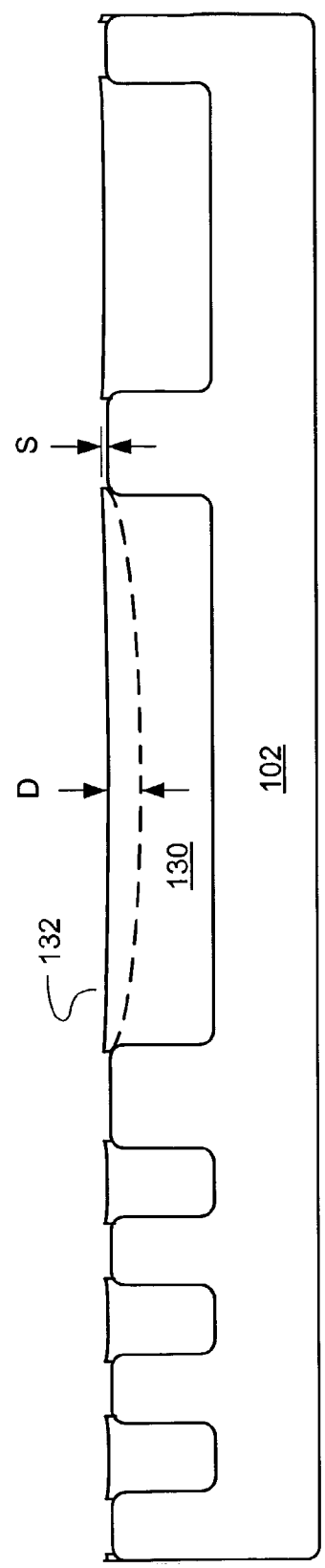
FIG. 7 is the structure of FIG. 6 after removal of the chemical-mechanical polishing stop layer.

Referring now to FIG. 7, therein is shown the structure of FIG. 6 after removal of the CMP stop layer 120. With the CMP stop layer 120 removed, the resulting semiconductor wafer 103 will be substantially planar. The step "S" of the present invention is exaggerated in size as is the dishing "D" of the prior art to indicate both that there is some insignificant step "S" remaining and that "S" is much less than "D" in planarity.

With the present invention the post-polish CMP step "S" is insignificant with regard to subsequent depositions. A conventional hierarchy of process steps is used up until the shallow trench-fill growth. After the shallow trench-fill growth, the semiconductor wafer is sent to planarization. The CMP process can use a ceria-based slurry that is highly selective to nitride (the slurry has a high oxide removal rate compared to nitride) so that the oxide over the active areas can be easily polished. Due to the high selectivity of ceria-based slurry to nitride, on reaching the nitride or silicon nitride, polishing halts and yields a planar wafer. In this way, the process remains insensitive to any amount of over polishing and thus has a broad process margin. The nitride can then be stripped.

Figure 8:
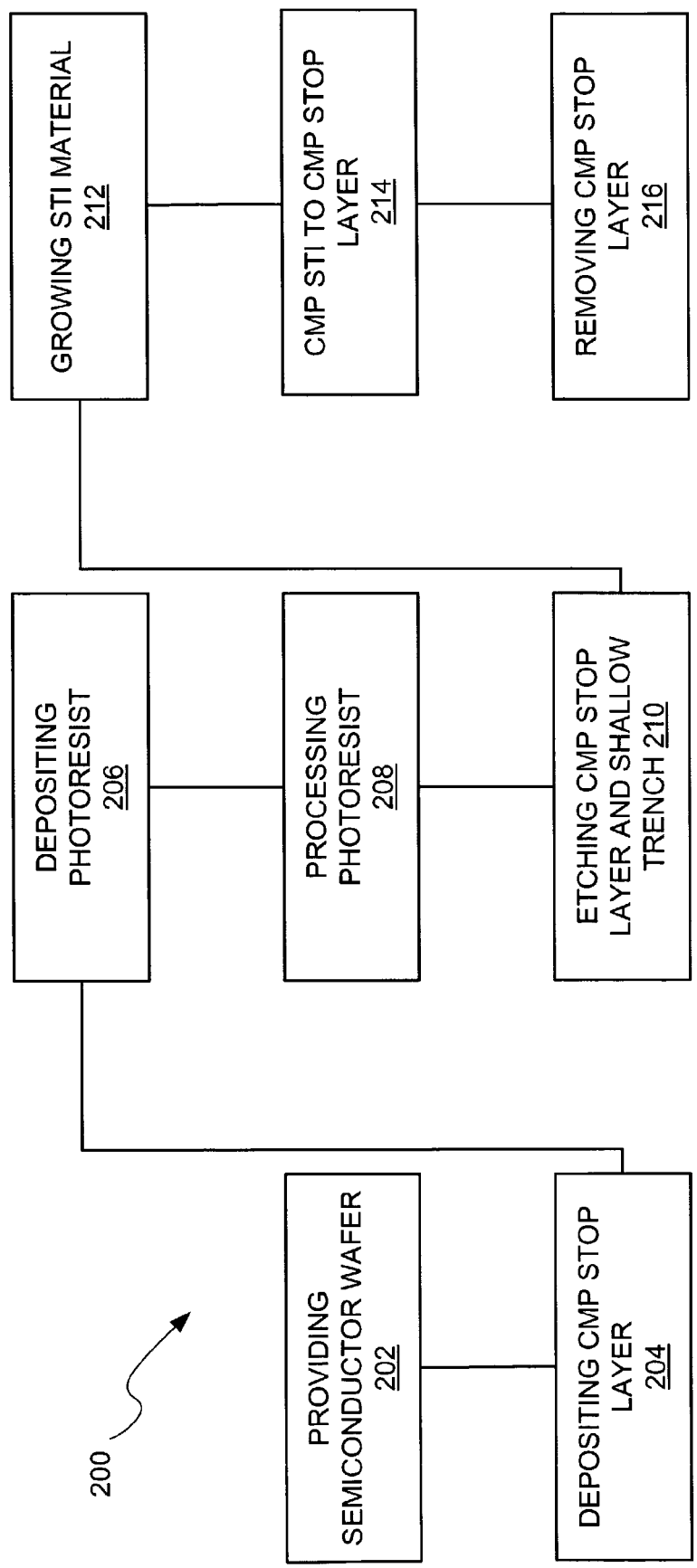
FIG. 8 is a simplified flow chart according to the present invention.

Referring now to FIG. 8, therein is shown a simplified flow chart 200 according to the present invention, which includes: providing semiconductor wafer 202; depositing CMP stop layer 204; depositing photoresist layer 206;

processing photoresist layer 208; etching CMP stop layer and shallow trench 210; growing STI material 212; CMP STI to CMP stop layer 214; and removing CMP stop layer 216.

Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing a planarized semiconductor wafer comprising:
   depositing a chemical-mechanical polishing stop layer on a semiconductor wafer;
   processing a photoresist layer over the chemical-mechanical polishing stop layer to form a patterned photoresist layer;
   processing to form a patterned chemical-mechanical polishing stop layer on the semiconductor wafer and to form a shallow trench in the semiconductor wafer using the patterned photoresist layer;
   growing shallow trench isolation material on the semiconductor wafer and over the chemical-mechanical polishing stop layer, the growing shallow trench isolation material having a selective tendency to have different rates of growth over the semiconductor wafer and the chemical-mechanical polishing stop layer; and
   chemical-mechanical polishing the shallow trench isolation material to be co-planar with the chemical-mechanical polishing stop layer.

2. The method of manufacturing as claimed in claim 1 wherein growing the shallow trench isolation material grows an oxide on the semiconductor wafer.

3. The method of manufacturing as claimed in claim 1 wherein growing the shallow trench isolation material grows an oxide on the chemical-mechanical polishing stop layer.

4. The method of manufacturing as claimed in claim 1 wherein growing the shallow trench isolation material uses a silane.

5. The method of manufacturing as claimed in claim 1 including removing the chemical-mechanical polishing stop layer.

6. The method of manufacturing as claimed in claim 1 wherein the chemical-mechanical polishing removes the shallow trench isolation material faster than material of the chemical-mechanical polishing stop layer.

7. The method of manufacturing as claimed in claim 1 wherein the growing of the shallow trench isolation material grows faster on the semiconductor wafer than on the chemical-mechanical polishing stop layer.

8. The method of manufacturing as claimed in claim 1 wherein the growing of the shallow trench isolation material grows thicker material over the material of the semiconductor wafer than over material of the chemical-mechanical polishing stop layer.

9. The method of manufacturing as claimed in claim 1 wherein the chemical-mechanical polishing of the shallow trench isolation material uses a selective slurry which removes the shallow trench isolation material faster than the material of the chemical-mechanical polishing stop layer.

10. A method of manufacturing a planarized silicon wafer comprising:
    providing a silicon wafer;
    depositing a nitride layer on the silicon wafer;
    processing a photoresist layer over the nitride layer to form a patterned photoresist layer;
    processing to form a patterned nitride layer on the silicon wafer and to form a shallow trench in the silicon wafer using the patterned photoresist layer;
    growing oxide on the silicon wafer and over the nitride layer, the growing oxide having a selective tendency to have different rates of growth over the silicon wafer and the nitride layer; and
    chemical-mechanical polishing the oxide to be co-planar with the nitride layer.

11. The method of manufacturing as claimed in claim 10 wherein growing the oxide grows an oxide on the silicon of the silicon wafer.

12. The method of manufacturing as claimed in claim 10 wherein growing the oxide grows an oxide on the nitride layer.

13. The method of manufacturing as claimed in claim 10 wherein growing the oxide uses tetraethoxysilane.

14. The method of manufacturing as claimed in claim 10 including removing the nitride layer.

15. The method of manufacturing as claimed in claim 10 wherein the chemical-mechanical polishing removes the oxide faster than the nitride layer.

16. The method of manufacturing as claimed in claim 10 wherein the growing of the oxide grows faster on the silicon of the silicon substrate than on the nitride layer.

17. The method of manufacturing as claimed in claim 10 wherein the growing of the oxide grows thicker material over the silicon of the silicon substrate than over the nitride layer.

18. The method of manufacturing as claimed in claim 10 wherein the chemical-mechanical polishing of the oxide uses a ceria-based slurry which removes the oxide faster that the material of the nitride layer.

* * * * *